United States Patent
Lee et al.

(10) Patent No.: US 7,864,605 B2
(45) Date of Patent: Jan. 4, 2011

(54) APPARATUS FOR REMOVING CROSSTALK IN SEMICONDUCTOR MEMORY DEVICE

(75) Inventors: Ji-Wang Lee, Gyeonggi-do (KR); Kun-Woo Park, Gyeonggi-do (KR); Yong-Ju Kim, Gyeonggi-do (KR); Hee-Woong Song, Gyeonggi-do (KR); Ic-Su Oh, Gyeonggi-do (KR); Hyung-Soo Kim, Gyeonggi-do (KR); Tae-Jin Hwang, Gyeonggi-do (KR); Hae-Rang Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 58 days.

(21) Appl. No.: 12/347,518

(22) Filed: Dec. 31, 2008

(65) Prior Publication Data
US 2009/0273995 A1    Nov. 5, 2009

(30) Foreign Application Priority Data
Apr. 30, 2008    (KR)    ........... 10-2008-0040369

(51) Int. Cl.
*G11C 7/00* (2006.01)
(52) U.S. Cl. ............................. 365/198; 365/206
(58) Field of Classification Search ............ 365/198, 365/206
See application file for complete search history.

(56) References Cited

U.S. PATENT DOCUMENTS

| 6,854,030 B2 | 2/2005 | Perino et al. |
| 7,052,967 B2 | 5/2006 | Lee et al. |
| 2007/0153886 A1 * | 7/2007 | Yukutake et al. ............ 375/222 |

FOREIGN PATENT DOCUMENTS

| JP | 2000-029925 | 1/2000 |
| JP | 2005-197637 | 7/2005 |
| KR | 100197551 B1 | 2/1999 |
| KR | 1019990039584 A | 6/1999 |
| KR | 1020030094683 A | 12/2003 |
| KR | 1020070003023 A | 1/2007 |

* cited by examiner

*Primary Examiner*—Hoai V Ho
*Assistant Examiner*—Fernando N Hidalgo
(74) *Attorney, Agent, or Firm*—IP & T Group LLP

(57) ABSTRACT

An apparatus for removing crosstalk in a semiconductor memory device includes pads for receiving externally provided signals, transmission lines for delivering the signals received by each of the pads to corresponding elements in the apparatus, and capacitors, coupled between adjacent ones of the lines, for adjusting the transmission delay of the signals depending on a signal transmission mode between the adjacent lines.

5 Claims, 4 Drawing Sheets

APPARATUS FOR REMOVING CROSSTALK IN SEMICONDUCTOR MEMORY DEVICE

CROSS-REFERENCE TO RELATED APPLICATIONS

The present invention claims priority of Korean patent application number 10-2008-0040369, filed on Apr. 30, 2008, which is incorporated by reference in its entirety.

BACKGROUND OF THE INVENTION

The present invention relates to crosstalk removal technology; and more particularly, to a crosstalk removal apparatus for a semiconductor memory device, which is capable of removing crosstalk that occurs due to coupling between transmission lines.

In semiconductor memory devices, details regarding electromagnetic fields that affect a signal when it is transmitted via a transmission line will be described below.

When a dielectric is coupled between metals, there is capacitance between them. That is, since a transmission line is made of metal and a dielectric is arranged between transmission lines, capacitance exists between them. It is known that even air is a dielectric, which has a relative dielectric constant equal to '1'. Therefore, even when transmission lines are arranged in the air, there is capacitance between them. When an alternating current in a high frequency band flows onto a transmission line, electrical interference occurs due to the influence of capacitance between transmission lines, i.e., mutual capacitance, as the current goes toward a higher frequency band. This also affects other electrical characteristics such as the characteristic impedance value of a transmission line. In addition, as an alternating current flows onto a transmission line, a magnetic field is induced, which produces mutual inductance affecting the magnetic field of another transmission line. This mutual inductance causes magnetic energy interference that affects the inductance value of each transmission line, etc., and thus affects the characteristic impedance value of each transmission line.

Meanwhile, coupling is a phenomenon in which alternate energies such as an electric field and a magnetic field are mutually transferred between separated spaces or transmission lines. When metals are brought close to each other, this phenomenon gives rise to interference with a signal that acts as an undesired parasitic effect. In view of ElectricMagnetic Interference (EMI), this unnecessary coupling is often called "crosstalk." In this description of the present invention, therefore, unnecessary mutual interference caused by coupling is defined as crosstalk, as will be set forth below.

Crosstalk occurs by mutual inductance and mutual capacitance. Such mutual inductance and mutual capacitance influence the total inductance and the total capacitance of a transmission line. The following is an explanation of the influence of mutual inductance and mutual capacitance in each mode, in an analysis of an ODD mode and EVEN mode in a coupled transmission line theory.

FIG. 3 shows an equivalent circuit model of a coupled transmission line, which has an equivalent circuit 310 of inductance and capacitance, an inductance equivalent circuit 320 and a capacitance equivalent circuit 330.

Signal modes between adjacent transmission lines can be largely classified into an ODD mode and an EVEN mode. When there are two transmission lines, the ODD mode and the EVEN mode are the ones when signals having a 180-degree phase difference and the same phase are applied to the two transmission lines, respectively. First, in the case of inductance, a voltage is generated by inductive coupling and currents $I_1$ and $I_2$ flowing onto two transmission lines in the inductance equivalent circuit 320 have the same amplitude and opposite directions to each other. Assuming that the self inductance $L_{11}=L_{22}=L_0$ and the mutual inductance $L_{12}=L_M$, $V_1$ and $V_2$ of the inductance equivalent circuit 320 may be expressed as:

$$V_1 = L_0 \frac{dI_1}{dt} + L_M \frac{dI_2}{dt} \qquad \text{Eq. (1)}$$

$$V_2 = L_0 \frac{dI_2}{dt} + L_M \frac{dI_1}{dt} \qquad \text{Eq. (2)}$$

In the ODD mode, $I_1=-I_2$, and $V_1=-V_2$, and therefore, these equations may be represented as follows:

$$V_1 = L_0 \frac{dI_1}{dt} + L_M \frac{d(-I_1)}{dt} = (L_0-L_M)\frac{dI_1}{dt} \qquad \text{Eq. (3)}$$

$$V_2 = L_0 \frac{dI_2}{dt} + L_M \frac{d(-I_2)}{dt} = (L_0-L_M)\frac{dI_2}{dt} \qquad \text{Eq. (4)}$$

$$L_{ODD} = L_{11}-L_M \qquad \text{Eq. (5)}$$

As can be seen from Eq. (5) above, the total inductance $L_{ODD}$ in the ODD mode becomes smaller than the self-inductance $L_{11}$ by the mutual inductance $L_M$.

Similarly, assuming that in the capacitance equivalent circuit 330 the self capacitance $C_{1G}=C_{2G}=C_0$ and the mutual capacitance $C_{12}=C_M$, $I_1$ and $I_2$ of the capacitance equivalent circuit 330 may be expressed as:

$$I_1 = C_0 \frac{dV_1}{dt} + C_M \frac{d(V_1-V_2)}{dt} = (C_0-C_M)\frac{dV_1}{dt} - C_M \frac{dV_2}{dt} \qquad \text{Eq. (6)}$$

$$I_2 = C_0 \frac{dV_2}{dt} + C_M \frac{d(V_2-V_1)}{dt} = (C_0-C_M)\frac{dV_2}{dt} - C_M \frac{dV_1}{dt} \qquad \text{Eq. (7)}$$

In the ODD mode, $I_1=-I_2$, and $V_1=-V_2$, and therefore, these equations may be defined as:

$$I_1 = C_0 \frac{dV_1}{dt} + C_M \frac{d(V_1-(-V_1))}{dt} = (C_0+2C_M)\frac{dV_1}{dt} \qquad \text{Eq. (8)}$$

$$I_2 = C_0 \frac{dV_2}{dt} + C_M \frac{d(V_2-(-V_2))}{dt} = (C_0+2C_M)\frac{dV_2}{dt} \qquad \text{Eq. (9)}$$

$$C_{ODD} = C_{1G} + 2C_M = C_{11} + C_M$$

$$C_{11} = C_{1G} + C_M \qquad \text{Eq. (10)}$$

As can be seen from Eq. (10) above, the total capacitance $C_{ODD}$ in the ODD mode becomes greater than the self-capacitance $C_{1G}$ by the mutual capacitance $2C_M$.

With the total inductance $L_{ODD}$ and the total capacitance $C_{ODD}$ in Eqs. (5) and (10) above, $Z_{ODD}$ and $TD_{ODD}$ may be defined as:

$$Z_{ODD} = \sqrt{\frac{L_{ODD}}{C_{ODD}}} = \sqrt{\frac{L_{11}-L_{12}}{C_{11}+C_{12}}} \qquad \text{Eq. (11)}$$

-continued $$TD_{ODD} = \sqrt{L_{ODD}C_{ODD}} = \sqrt{(L_{11} - L_{12})(C_{11} + C_{12})} \quad \text{Eq. (12)}$$

The EVEN mode is one in which signals having the same phase and the same amplitude are applied to the two transmission lines, respectively. First, in the case of inductance, a voltage is generated by an inductive coupling and currents $I_1$ and $I_2$ flowing onto the two transmission lines in the inductance equivalent circuit 320 have the same amplitude and the same directions. Assuming that the self-inductance $L_{11}=L_{22}=L_0$ and the mutual inductance $L_{12}=L_M$, $V_1$ and $V_2$ of the inductance equivalent circuit 320 may be expressed as Eqs. (1) and (2) above. And, in the ODD mode, $I_1=I_2$, and $V_1=V_2$, and therefore, these equations may be represented as:

$$V_1 = L_0 \frac{dI_1}{dt} + L_M \frac{d(I_1)}{dt} = (L_0 + L_M) \frac{dI_1}{dt} \quad \text{Eq. (13)}$$

$$V_2 = L_0 \frac{dI_2}{dt} + L_M \frac{d(I_2)}{dt} = (L_0 + L_M) \frac{dI_2}{dt} \quad \text{Eq. (14)}$$

$$L_{EVEN} = L_{11} + L_M \quad \text{Eq. (15)}$$

As can be seen from Eq. (15) above, the total inductance $L_{EVEN}$ in the EVEN mode has the self-inductance $L_{11}$ added to the mutual inductance $L_M$.

Similarly, assuming that in the capacitance equivalent circuit 330 the capacitance may be expressed by Eqs. (6) and (7) above, and in the EVEN mode, $I_1=I_2$, and $V_1=V_2$, and therefore, $I_1$ and $I_2$ may be represented again as:

$$I_1 = C_0 \frac{dV_1}{dt} + C_M \frac{d(V_1 - V_1)}{dt} = C_0 \frac{dV_1}{dt} \quad \text{Eq. (16)}$$

$$I_2 = C_0 \frac{dV_2}{dt} + C_M \frac{d(V_2 - V_2)}{dt} = C_0 \frac{dV_2}{dt} \quad \text{Eq. (17)}$$

$$C_{EVEN} = C_{1G} = C_{11} - C_M$$

$$C_{11} = C_{1G} + C_M \quad \text{Eq. (18)}$$

Accordingly, the total capacitance $C_{EVEN}$ in the EVEN mode becomes equal to the self-capacitance $C_{1G}$, as shown in Eq. (18) above. Using the total inductance $L_{EVEN}$ and the total capacitance $C_{EVEN}$ in Eqs. (15) and (18) above, $Z_{EVEN}$ and $TD_{EVEN}$ may be defined as:

$$Z_{EVEN} = \sqrt{\frac{L_{EVEN}}{C_{EVEN}}} = \sqrt{\frac{L_{11} + L_{12}}{C_{11} - C_{12}}} \quad \text{Eq. (19)}$$

$$TD_{EVEN} = \sqrt{L_{EVEN}C_{EVEN}} = \sqrt{(L_{11} + L_{12})(C_{11} - C_{12})} \quad \text{Eq. (20)}$$

As mentioned above, the characteristic impedance of a transmission line varies depending on adjacent transmission lines and a signal mode due to the influence of coupling between the adjacent transmission lines, which causes a difference in the transmission rates of signals. As a result, this transmission rate difference acts as a factor that impairs a timing margin.

There are various methods to compensate the discrepancy in the transmission rate of signal, i.e., skew. As one of these methods, a Delayed Locked Loop (DLL) is frequently used for the purpose. However, devices using such a method require numerous control signals therein and thus occupy a complex and wider area, together with much power consumption for such reasons.

SUMMARY OF THE INVENTION

Embodiments of the present invention are directed to providing a crosstalk removal apparatus with a simple structure and low power consumption, for use in a semiconductor memory device.

In accordance with the invention, an apparatus for removing crosstalk in a semiconductor memory device includes pads for receiving externally provided signals, transmission lines for delivering the signals received by each of the pads to corresponding elements in the apparatus, and capacitors, coupled between adjacent ones of the transmission lines, for adjusting the transmission delay of the signals depending on a signal transmission mode between the adjacent lines.

As discussed above, the prior art device employs a series of transistor level circuits being controlled in an analog or digital manner in order to compensate skew. On the other hand, the invention inserts a capacitor between adjacent transmission lines as an ODD mode transmission rate is the fastest signal transmission mode between the adjacent lines, thereby delaying the transmission rate of a signal transmitted in the ODD mode. That is to say, the capacitor coupled between the adjacent transmission lines does not operate since the space between the transmission lines is in a virtual open state in the EVEN mode, but it operates by an electric potential difference between the transmission lines in the ODD mode, thereby compensating skew by signal delay.

DESCRIPTION OF SPECIFIC EMBODIMENTS

Hereinafter, preferred embodiments in accordance with the present invention will be described in detail with reference to the accompanying drawings so that the invention can readily be practiced by those skilled in the art to which the invention pertains.

As noted earlier, a difference in signal transmission rates occurs depending on a signal mode between adjacent transmission lines. In order to reduce the transmission rate of an ODD mode signal, which is the mode with the least transmission delay, in some embodiments of the invention, one or more capacitors are inserted between transmission lines, as follows.

Figure 1:
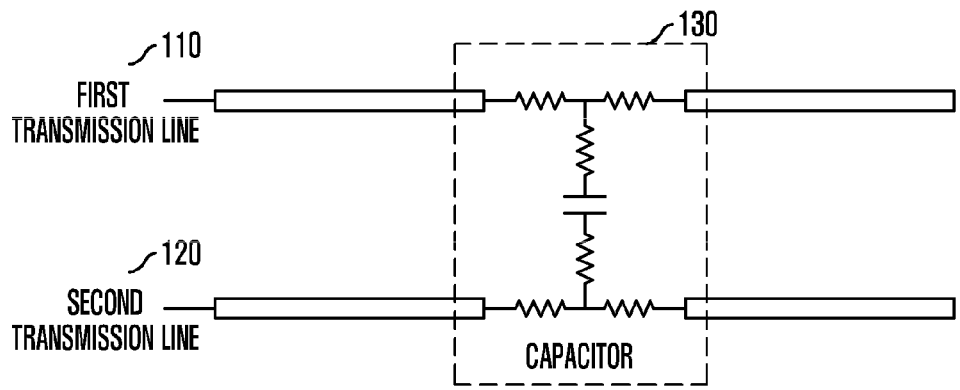
FIG. 1 is a circuit diagram of a crosstalk removal apparatus for a semiconductor memory device in accordance with an embodiment of the present invention.

FIG. 1 is a circuit diagram of a crosstalk removal apparatus for a semiconductor memory device in accordance with an embodiment of the invention.

Referring to FIG. 1, the crosstalk removal apparatus for the semiconductor memory device of this embodiment includes first and second transmission lines 110 and 120 for transferring signals, and a capacitor C coupled between the two transmission lines 110 and 120 for adjusting the transmission delay of the signals, depending on a signal transmission mode between the transmission lines. In addition, the crosstalk removal apparatus further includes resistors R0 to R5 that are coupled to the capacitor C and constitute a passive circuit network 130.

Now, the operation of the crosstalk removal apparatus for the semiconductor memory device with the above configuration will be described in detail.

The capacitor C coupled between the two transmission lines 110 and 120 does not operate since the space between them is in a virtual open state in an EVEN mode therebetween. However, in an ODD mode, the capacitor C operates by an electric potential difference between the two transmission lines, causing the signals to be delayed. As a result, the transmission rate of an ODD mode signal that is relatively fast becomes slow, and therefore, a difference in rate as between the ODD mode and the EVEN mode, that is, skew can be compensated. As briefly noted above, the crosstalk removal apparatus for the semiconductor memory device of this embodiment may further include the passive circuit network 130 that also has the resistors R0 to R5 in order to delay the signals more effectively depending on applied circuits.

Figure 2:
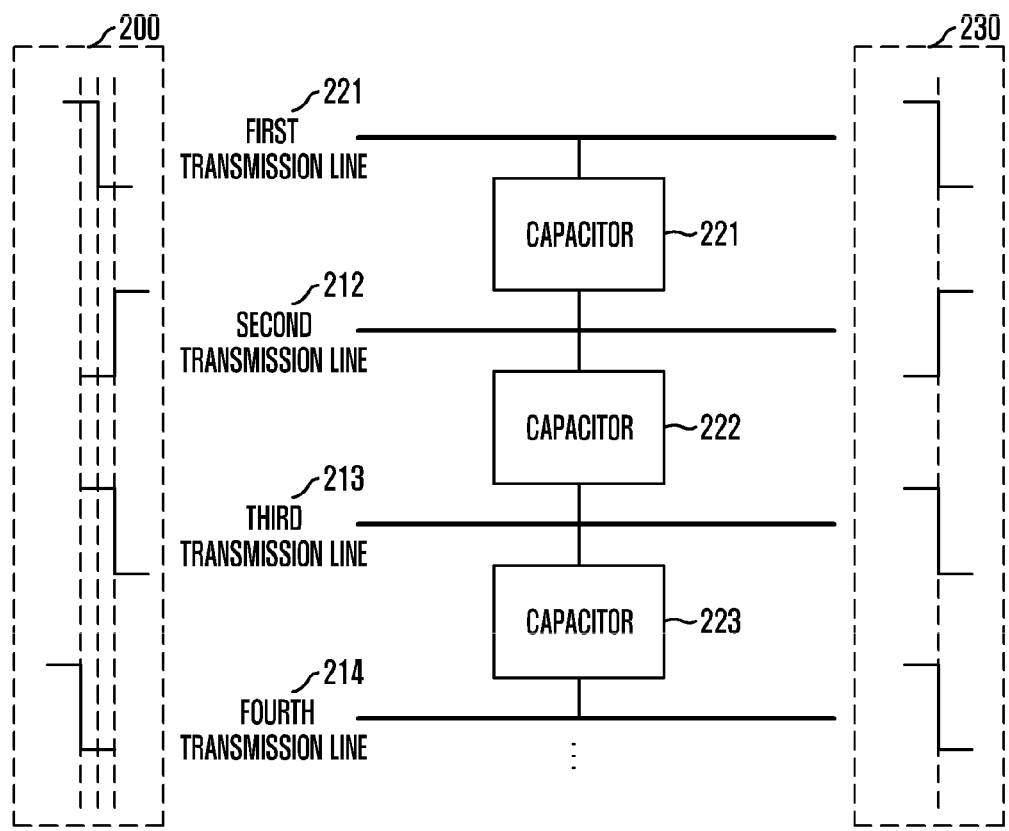
FIG. 2 is a circuit diagram of a crosstalk removal apparatus for a semiconductor memory device in accordance with another embodiment of the invention.
Figure 3:
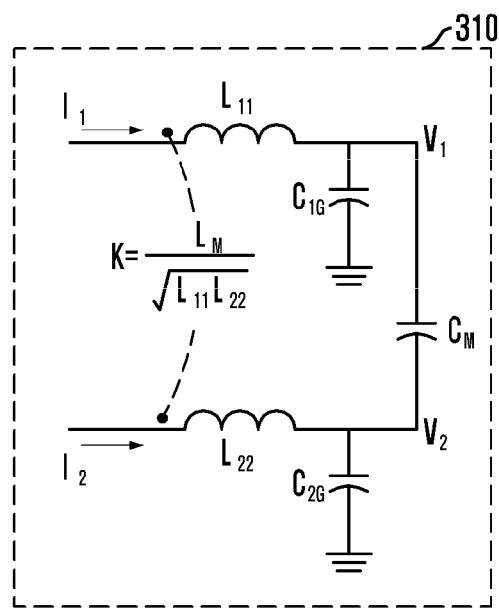
FIG. 3 is an equivalent circuit model of a coupled transmission line.
Figure 3:
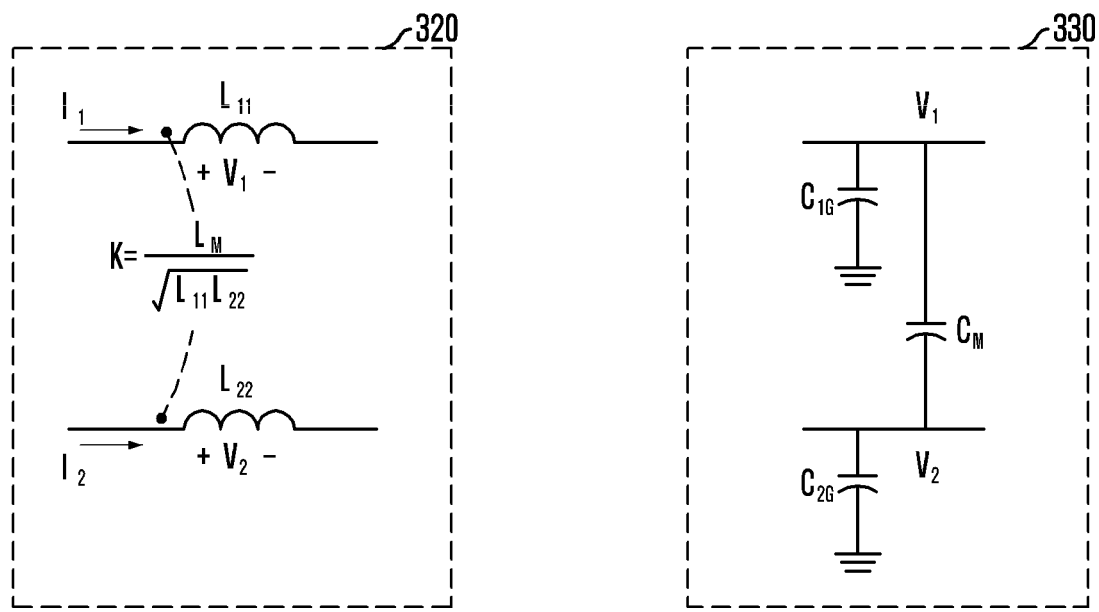

FIG. 2 is a circuit diagram of a crosstalk removal apparatus for a semiconductor memory device in accordance with another embodiment of the invention.

Referring to FIG. 2, the crosstalk removal apparatus for the semiconductor memory device of this embodiment includes transmission lines 211 to 214 for transferring signals, and capacitors 221 to 223 coupled between the transmission lines 211 and 214 for adjusting the transmission delay of the signals depending on a signal transmission mode between adjacent transmission lines.

The crosstalk removal apparatus for the semiconductor memory device with the configuration as employed above has the capacitors inserted between the transmission lines. That is, the crosstalk removal apparatus for the semiconductor memory device has a capacitor 221 coupled between first and second transmission lines 211 and 212, a capacitor 222 coupled between the second and third transmission lines 212 and 213, etc. As in the embodiment of FIG. 1, when the ODD mode is set between the transmission lines to which the capacitors are coupled, each of the capacitors is activated to delay an ODD mode signal. Left-side signals 200 show the timing of the waveforms mismatched due to crosstalk, while right-side signals 230 depict the timing of the waveforms aligned by compensating for such crosstalk.

While the embodiment of FIG. 2 allows for crosstalk that occurs only between adjacent transmission lines among many transmission lines, it may be implemented to remove crosstalk by setting a certain range of transmission lines based on the degree of influence of crosstalk that occurs between the adjacent transmission lines, where necessary.

Figure 4:
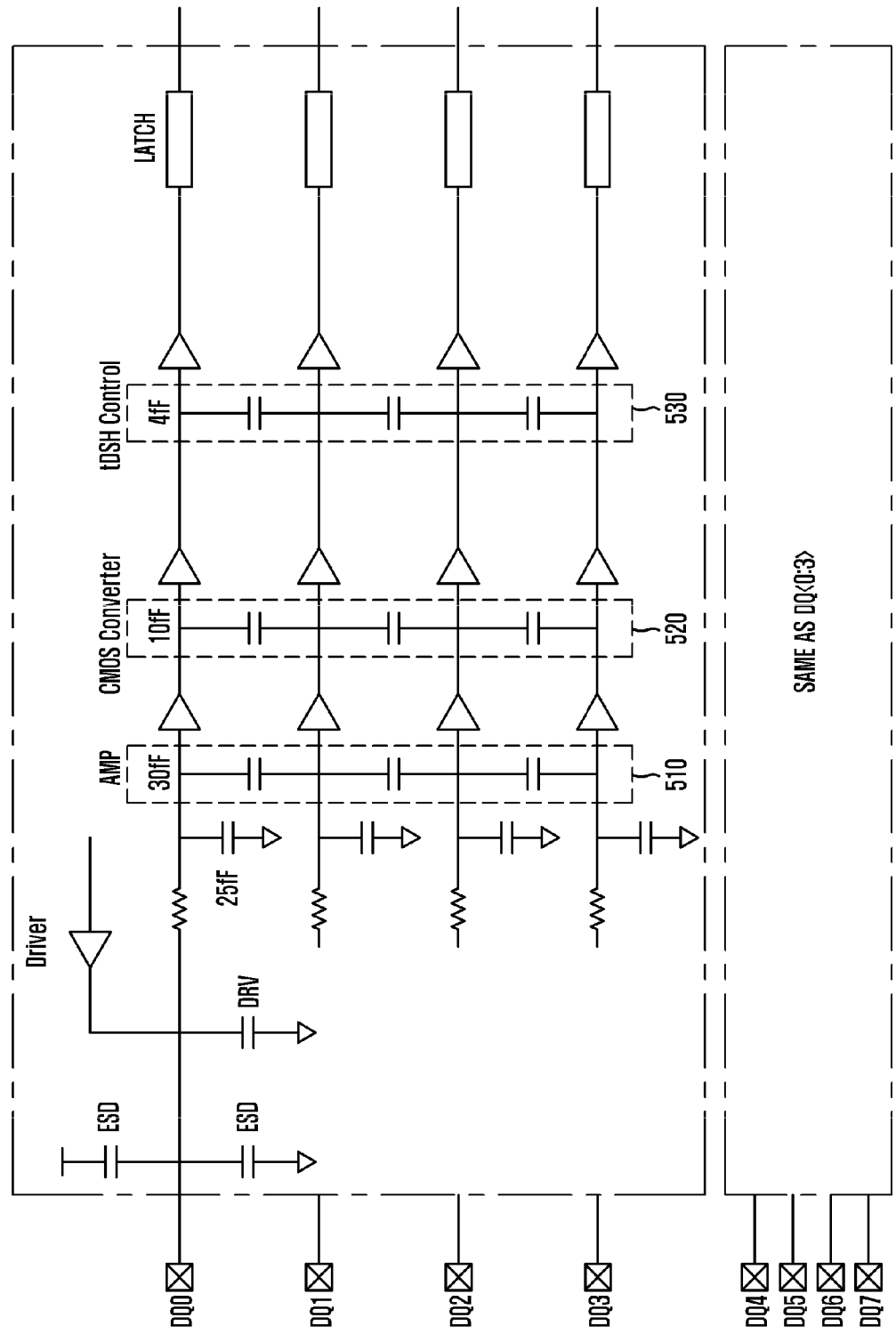
FIG. 4 is a circuit diagram of a crosstalk removal apparatus for a semiconductor memory device in accordance with still another embodiment of the invention.

FIG. 4 is a circuit diagram of a crosstalk removal apparatus for a semiconductor memory device in accordance with still another embodiment of the invention.

Referring to FIG. 4, the crosstalk removal apparatus for the semiconductor memory device of this embodiment includes pads DQ0 to DQ7 for receiving externally provided signals, transmission lines T0 to T7 for conveying the signals applied to each of the pads DQ0 to DQ7 to the inside of the apparatus, and capacitors 510, 520 and 530 coupled between adjacent transmission lines for adjusting the transmission delay of the signals depending on a signal transmission mode between the adjacent transmission lines.

This embodiment is applied at a receiver end of the semiconductor memory device. The plurality of capacitors 510 to 530, which are coupled between their respective adjacent transmission lines, operate when the ODD mode is set between the adjacent transmission lines to delay the signals on the transmission lines, thereby compensating skew between the signal modes caused by crosstalk.

Figure 5:
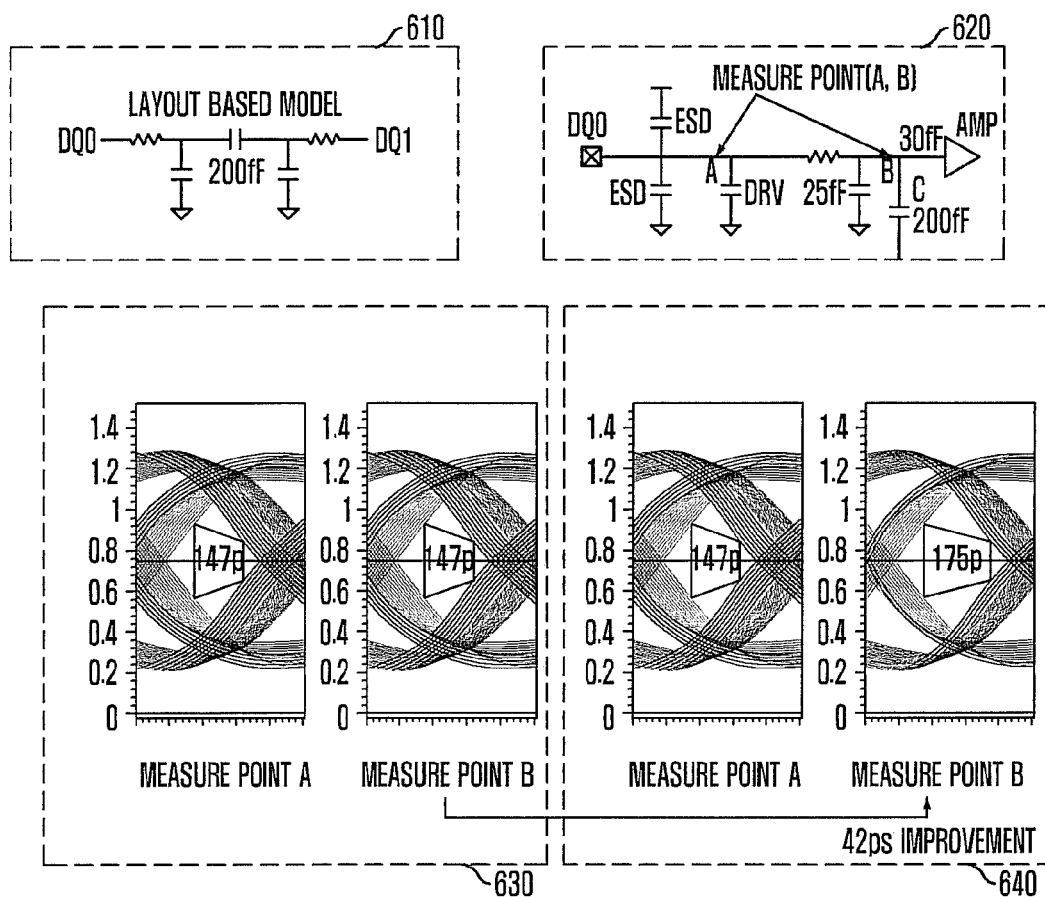
FIG. 5 is the simulation result of a crosstalk removal apparatus for the semiconductor memory device in accordance with the embodiment of the invention.

FIG. 5 shows simulation results for the crosstalk removal apparatus for the semiconductor memory device in accordance with the embodiment of the invention.

Referring to FIG. 5, a capacitor is arranged between transmission lines of the receiver end of the semiconductor memory device, as in a layout model 610 of a circuit to which the invention is applied. A first measurement point A in a simulation measurement section 620 indicates a point before a signal transferred via the pad DQ passes through a capacitor C, and a second measurement point B indicates a point just ahead of an input buffer AMP where the capacitor C is arranged. According to the simulation results measured, the simulation result 630 before the invention is applied shows that there was no variation in signal characteristics between the first measurement point A and the second measurement point B. However, the simulation result 640 after the invention is applied shows that the signal characteristic at the second measurement point B is superior to that at the first measurement point A, thereby further securing the timing margin of signal being applied to the input buffer AMP.

Even though this embodiment of the invention removed crosstalk that occurs only between adjacent transmission lines among many transmission lines, it should be noted that the embodiment may be implemented to remove crosstalk by setting a certain range of transmission lines based on the degree of influence of crosstalk that occurs between the adjacent transmission lines, where necessary. Since there may be a lot of variations and such variations may easily be derived by those skilled in the art, details thereon will be omitted here for the sake of brevity.

As described above, the invention can consistently maintain the transmission rate of a signal by effectively compensating skew caused by crosstalk. Thus, the invention improves the timing margin of a signal to achieve a higher rate signal transmission. The crosstalk removal apparatus with capacitors and resistors in accordance with the invention does not require control signals, transistor level control circuits, etc., but can be comprised of only passive circuit networks between transmission lines. Accordingly, the invention is highly advantageous in limiting power consumption, area, costs, etc.

While the invention has been described with respect to specific embodiments, it will be apparent to those skilled in the art that various changes and modifications may be made without departing from the spirit and scope of the invention as defined in the following claims.

What is claimed is:

1. An apparatus for removing crosstalk in a semiconductor memory device, comprising;
   a plurality of pads that receive externally provided signals,
   a plurality of transmission lines to deliver the received signals from the pads to corresponding elements in the apparatus; and
   a plurality of capacitors, wherein the plurality of capacitors are each coupled between respective adjacent lines among the plurality of transmission lines for adjusting transmission delays of the signals transmitted on the adjacent lines according to a signal transmission mode between the adjacent lines, and wherein the signal transmission mode includes: a first mode in which signals having the same phase are applied to the adjacent lines; and a second mode in which signals having a 180-degree phase difference are applied to the adjacent lines, wherein in the first mode, the respective capacitor coupled to the adjacent lines adds no delay to the signals transmitted through the respective adjacent lines and in the second mode, the capacitor delays the signals transmitted through the respective adjacent lines.

2. The apparatus of claim 1, further comprising a plurality of resistors coupled to each of the capacitors and constituting a passive circuit network.

3. The apparatus of claim 1, wherein the capacitors are each coupled to a node located between an input buffer of a respective one of the transmission lines and a respective one of the pads.

4. The apparatus of claim 1, wherein the signal transmission mode includes:

an even mode in which signals having the same phase and the same amplitude are applied to the adjacent lines; and an odd mode in which signals having a 180-degree phase difference and the same amplitude are applied to the adjacent lines.

5. The apparatus of claim 1, wherein the capacitors are each coupled between the respective adjacent lines rather than to ground.

* * * * *